(12) United States Patent
Roh et al.

(10) Patent No.: US 9,948,484 B2
(45) Date of Patent: Apr. 17, 2018

(54) METHOD AND APPARATUS FOR DIRECT CONVERSION RECEIVER CORRECTING DIRECT CURRENT OFFSET

(71) Applicant: Samsung Electronics Co., Ltd., Suwon-si, Gyeonggi-do (KR)

(72) Inventors: Yi-Ju Roh, Suwon-si (KR); Ji-Hoon Kim, Suwon-si (KR); Ju-Ho Son, Seoul (KR); Yun-A Shim, Hoengseong-gun (KR); Dong-Hyun Lee, Anyang-si (KR); Dong-Yun Jung, Anyang-si (KR); Sung-Tae Choi, Hwaseong-si (KR); Seung-Pyo Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/109,376

(22) PCT Filed: Jan. 2, 2015

(86) PCT No.: PCT/KR2015/000023
§ 371 (c)(1),
(2) Date: Jun. 30, 2016

(87) PCT Pub. No.: WO2015/102431
PCT Pub. Date: Jul. 9, 2015

(65) Prior Publication Data
US 2016/0330049 A1 Nov. 10, 2016

(30) Foreign Application Priority Data

Jan. 3, 2014 (KR) .................. 10-2014-0000777

(51) Int. Cl.
*H04L 25/06* (2006.01)
*H04L 25/10* (2006.01)
*H04B 1/30* (2006.01)

(52) U.S. Cl.
CPC .............. *H04L 25/06* (2013.01); *H04B 1/30* (2013.01); *H03D 2200/0047* (2013.01); *H04B 2001/305* (2013.01)

(58) Field of Classification Search
CPC ... H04L 25/061; H04L 25/062; H04L 25/063; H04L 25/06; H04L 27/3809; H04B 1/30;
(Continued)

(56) References Cited

U.S. PATENT DOCUMENTS 5,789,974 A * 8/1998 Ferguson, Jr. .......... H03F 1/304
330/2
6,411,647 B1 * 6/2002 Chan ........................ H04B 3/23
341/130

(Continued)

FOREIGN PATENT DOCUMENTS

KR 10-2002-0021075 A 3/2002
KR 10-2012-0140550 A 12/2012

OTHER PUBLICATIONS

Xiangning, "An Efficient CMOS DC offset Cancellation Circuit for PGA of LOW IF Wireless Receivers", Nanjing, China, p. 1-5.

*Primary Examiner* — James M Perez
(74) *Attorney, Agent, or Firm* — Jefferson IP Law, LLP (57) ABSTRACT

The present invention relates to a method and an apparatus for direct current offset calibration of a direct conversion receiver, a Direct Current (DC) offset calibration apparatus of a direct conversion receiver includes a plurality of variable gain amplifiers for amplifying an input signal based on a gain control value, a DC offset monitoring unit for monitoring a DC offset for an output signal of the plurality of variable gain amplifiers, a plurality of variable Digital to (Continued)

Analog Converters (DACs) for controlling a current applied to each of the plurality of variable gain amplifiers according to a current control code, and a DC offset cancellation unit for determining a current control code set which minimizes the DC offset value per preset gain control value, and thus the DC offset can be precisely cancelled without being affected by external factors such as a signal modulation method and heat and performance degradation of the receiver can be prevented.

18 Claims, 6 Drawing Sheets

(58) Field of Classification Search
CPC .... H03G 3/3052; H03G 3/3068; H03G 3/001; H03G 3/3078
USPC .................................. 375/316–352
See application file for complete search history.

(56) References Cited

U.S. PATENT DOCUMENTS

| | | | | |
|---|---|---|---|---|
| 6,560,448 B1* | 5/2003 | Baldwin | ................ | H03D 3/008 375/341 |
| 6,956,433 B2* | 10/2005 | Kim | ...................... | H03F 1/3247 330/149 |
| 7,132,861 B1* | 11/2006 | Fu | ...................... | H03F 3/45744 327/52 |
| 7,215,266 B2* | 5/2007 | Li | ....................... | H03M 1/1019 341/118 |
| 7,239,199 B1* | 7/2007 | Chien | ................ | H03F 3/45085 330/259 |
| 7,323,922 B1* | 1/2008 | Jones | ..................... | H03G 3/001 327/308 |
| 7,622,987 B1* | 11/2009 | Zortea | ....................... | H03F 1/32 330/279 |
| 8,255,183 B1* | 8/2012 | Husted | .............. | H04B 17/0085 702/117 |
| 8,463,225 B2* | 6/2013 | Igarashi | .................. | H04B 1/30 375/345 |
| 8,868,007 B2* | 10/2014 | Terry | ....................... | H04B 1/30 455/130 |
| 9,705,465 B2* | 7/2017 | Bodnar | ................ | H03G 3/3042 |
| 2002/0042256 A1* | 4/2002 | Baldwin | ................ | H03D 3/008 455/232.1 |
| 2002/0047744 A1* | 4/2002 | Ichihara | .............. | H03G 1/0088 330/133 |
| 2002/0197975 A1* | 12/2002 | Chen | ..................... | H03D 3/008 455/324 |
| 2004/0121746 A1* | 6/2004 | Akamine | ............. | H03G 3/3052 455/130 |
| 2004/0247046 A1* | 12/2004 | Hsiao | .................... | H04L 25/061 375/319 |
| 2005/0258989 A1* | 11/2005 | Li | ....................... | H03M 1/1019 341/120 |
| 2006/0077003 A1* | 4/2006 | Chiu | ......................... | H03F 1/02 330/9 |
| 2006/0217069 A1* | 9/2006 | Chen | ....................... | H04B 1/30 455/63.1 |
| 2006/0279444 A1* | 12/2006 | Eo | ............................ | H04B 1/30 341/144 |
| 2007/0129030 A1* | 6/2007 | Litmanen | ............. | H03F 1/0205 455/127.1 |
| 2007/0230622 A1* | 10/2007 | Joseph | .................... | H04B 1/30 375/319 |
| 2007/0280338 A1* | 12/2007 | Haub | ........................ | H04B 1/30 375/222 |
| 2008/0280579 A1* | 11/2008 | Cloutier | .................. | H04B 1/30 455/259 |
| 2009/0212983 A1* | 8/2009 | Fukuzawa | ........... | H03F 3/45475 341/142 |
| 2010/0075624 A1* | 3/2010 | Shanan | .................... | H04B 1/30 455/253.2 |
| 2011/0076977 A1* | 3/2011 | Coban | ...................... | H04B 1/16 455/234.2 |
| 2011/0286553 A1* | 11/2011 | Min | ........................ | H04B 1/30 375/319 |
| 2012/0034875 A1* | 2/2012 | Moritsuka | ............... | H03F 3/195 455/63.1 |
| 2012/0196555 A1* | 8/2012 | Igarashi | .................. | H04B 1/30 455/341 |
| 2012/0326787 A1* | 12/2012 | Kang | .................. | H03F 3/45098 330/254 |
| 2013/0043943 A1* | 2/2013 | Chen | ....................... | H03G 1/04 330/97 |
| 2013/0136213 A1* | 5/2013 | Kobayashi | ............. | H03F 3/189 375/340 |
| 2013/0223569 A1* | 8/2013 | Ito | .......................... | H04L 25/06 375/319 |
| 2014/0036982 A1* | 2/2014 | Ali | .......................... | H04B 3/04 375/229 |
| 2014/0176238 A1* | 6/2014 | Guo | .................. | H03F 3/45475 330/254 |
| 2015/0061769 A1* | 3/2015 | Bodnar | ................ | H03G 3/3042 330/282 |
| 2017/0288618 A1* | 10/2017 | Asmanis | .................. | H03F 3/08 |

* cited by examiner

METHOD AND APPARATUS FOR DIRECT CONVERSION RECEIVER CORRECTING DIRECT CURRENT OFFSET

TECHNICAL FIELD

The present invention relates generally to a method and an apparatus for calibrating a direct current offset in a direct conversion receiver.

BACKGROUND ART

Typically, a Radio Frequency (RF) receiver used in a wireless communication system can be divided into a receiver which uses a direct conversion method and a receiver which uses a heterodyne method. The direct conversion method indicates a method for directly converting a low frequency baseband signal and a high frequency signal, that is, an RF signal, and the heterodyne method indicates a method for going through an intermediate step which converts to an Intermediate Frequency (IF) and then converting and processing to an intended frequency band signal without directly converting a baseband signal and an RF signal.

The direct conversion method, compared with the heterodyne method, does not require a part for performing the IF conversion and includes a plurality of gain stages at an analog baseband stage. As a receiver using the direct conversion method includes the plurality of the gain stages, a great Direct Current (DC) offset can generate in proportion to a gain. However, as the DC offset increases, a performance of the receiver lowers. In a severe case, it can be difficult to receive a signal. Hence, it is necessary to suggest a method for calibrating the DC offset. Herein, mostly, the DC offset indicates a common mode voltage difference generated in two signal paths, that is, a DC level difference in a circuit of a differential structure having the two signal paths.

To cancel the DC offset, the related art used a method for cutting off low frequencies using a high pass filter or a low pass filter. However, such a method has a disadvantage of causing signal attenuation according to a modulation method or a cutoff frequency of the pass filter and thus degrading the performance of the receiver.

DISCLOSURE OF INVENTION

Technical Problem

Thus, an embodiment of the present invention is to provide a method and an apparatus for calibrating a Direct Current (DC) offset in a direct conversion receiver including a plurality of gain stages.

Another embodiment of the present invention is to provide a method and an apparatus for canceling a DC offset using a plurality of variable Digital Analog Converters (DACs) in a direct conversion receiver.

Yet another embodiment of the present invention is to provide a method and an apparatus for determining a current control code of a variable DAC so as to minimize a DC offset per variable gain amplifier in a direct conversion receiver including a plurality of variable gain amplifiers and a plurality of variable DACs.

Still another embodiment of the present invention is to provide a method and an apparatus for determining a current control code of a variable DAC so as to minimize a DC offset per preset automatic gain control code in a direct conversion receiver including a plurality of variable gain amplifiers and a plurality of variable DACs.

A further embodiment of the present invention to provide a method and an apparatus for calibrating a DC offset based on a current control code of a variable DAC determined through a DC offset calibration process when a system is powered on in a direct conversion receiver.

A further embodiment of the present invention is to provide a method and an apparatus for detecting a DC offset change due to a temperature change, and calibrating the DC offset by regulating a base current of a variable DAC in a direct conversion receiver.

Solution to Problem

According to an embodiment of the present invention, an apparatus for Direct Current (DC) offset calibration of a direct conversion receiver can include a plurality of variable gain amplifiers for amplifying an input signal based on a gain control value, a DC offset monitoring unit for monitoring a DC offset for an output signal of the plurality of variable gain amplifiers, a plurality of variable Digital to Analog Converters (DACs) for controlling a current applied to each of the plurality of variable gain amplifiers according to a current control code, and a DC offset cancellation unit for determining a current control code set which minimizes the DC offset value per preset gain control value.

According to an embodiment of the invention, a method of operating a direct conversion receiver for DC offset calibration can include controlling, at a plurality of variable DACs, a current applied to each of a plurality of variable gain amplifiers using a current control code, amplifying, at the plurality of variable gain amplifiers, an input signal based on a gain control value, monitoring a DC offset for an output signal amplified through the plurality of variable gain amplifiers, and determining a current control code set which minimizes the DC offset monitoring value per preset gain control value based on the DC offset monitoring result.

Advantageous Effects of Invention

The present invention determines the current control code of the variable Digital to Analog Converters (DACs) so as to minimize the Direct Current (DC) offset per variable gain amplifiers in the direct conversion in receiver including the plurality of variable gain amplifiers and the plurality of variable DAC, and calibrates the DC offset based on the determined current control code. Thus, it is possible to precisely cancel the DC offset and prevent performance degradation of the receiver without being affected by external factors such as a signal modulation method and heat.

BEST MODE FOR CARRYING OUT THE INVENTION

Preferred embodiments of the present invention will now be described with reference to the accompanying drawings. In descriptions of the present invention, when specific description of well-known functions or configuration is determined to unnecessarily obscure the subject matter of the present invention, its detailed description shall be omitted. Further, terms described below are defined in consideration of functions of the present invention, and can vary according to a user, an operator's intention, or practice. Therefore, the definition should be made based on descriptions throughout the specification.

In various embodiments of the present invention, an expression such as "have", "can have", "include" or "can include" refers to presence such as a corresponding function, operation, or component of the disclosure, and does not limit additional one or more functions, operations, or components. In addition, in various embodiments of the present invention, a term such as "include" or "have" is intended to designate presence of a characteristic, a number, a step, an operation, a component, a part or their combination disclosed in the specification, and it should be appreciated that it does not exclude in advance the presence or addition of one or more other characteristics, numbers, steps, operations, components, parts, or combinations thereof.

In various embodiments of the present invention, an expression such as "A or B" or "at least one of A or/and B" includes any and every combination of words listed together. For example, "A or B" or "at least one of A or/and B" each may include A, B, or both of A and B.

Expressions such as "1st", "2nd", "first" or "second" used in various embodiments of the present invention can modify various components of various embodiments, but does not limit the corresponding components. For example, the expressions do not limit to sequence and/or importance of the corresponding components. The expressions can be used to distinguish one component from another component. For example, a first user device and a second user device both are user devices and represent different user devices. For example, a first component can be named as a second component, and similarly, a second component can be named as a first component without departing from the scope of various embodiments of the present invention.

When a certain component is mentioned as being "connected to" or "coupled to", the certain component may be directly connected to or coupled to the another component but it is to be understood that a new different component may be present between the certain component and the another component. On the other hand, when a certain component is mentioned as being "directly connected to" or "directly coupled to", it is be understood that other new component is not present between the certain component and the another component.

An expression "configured to (or set)" used in the present document can be used interchangeably with, for example, "suitable for," "having the capacity to," "designed to," "adapted to," "made to," or "capable of" according to a situation. A term "configured to (or set)" does not only mean "specifically designed to" by hardware. Instead, in some situations, an expression "apparatus configured to" can mean that the apparatus "can" operate together with another apparatus or components. For example, a phrase "a processor configured (or set) to perform A, B, and C" can represent an exclusive processor (e.g., an embedded processor) for performing a corresponding operation, or a generic-purpose processor (e.g., a Central Processing Unit (CPU) or an application processor) which can perform a corresponding operation by executing one or more software programs stored in a memory device.

Terms used in the various embodiments of the present invention are used merely to describe particular embodiments, and are not intended to limit the various embodiments of the present invention. A singular expression may include a plural expression unless there is a contextually distinctive difference.

Unless otherwise defined, all terms used herein including technical and scientific terms have the same meaning as commonly understood by those ordinarily skilled in the art to which various embodiments of the present invention belong. It will be understood that terms such as those defined in commonly used dictionaries, should be interpreted as having a meaning that is consistent with their meaning in the context of the relevant art, and will not be interpreted in an idealized or overly formal sense unless expressly so defined herein.

Hereafter, the present invention is to explain a method and an apparatus for canceling a Direct Current (DC) offset using a plurality of variable Digital Analog Converters (DACs) in a direct conversion receiver.

Figure 1:
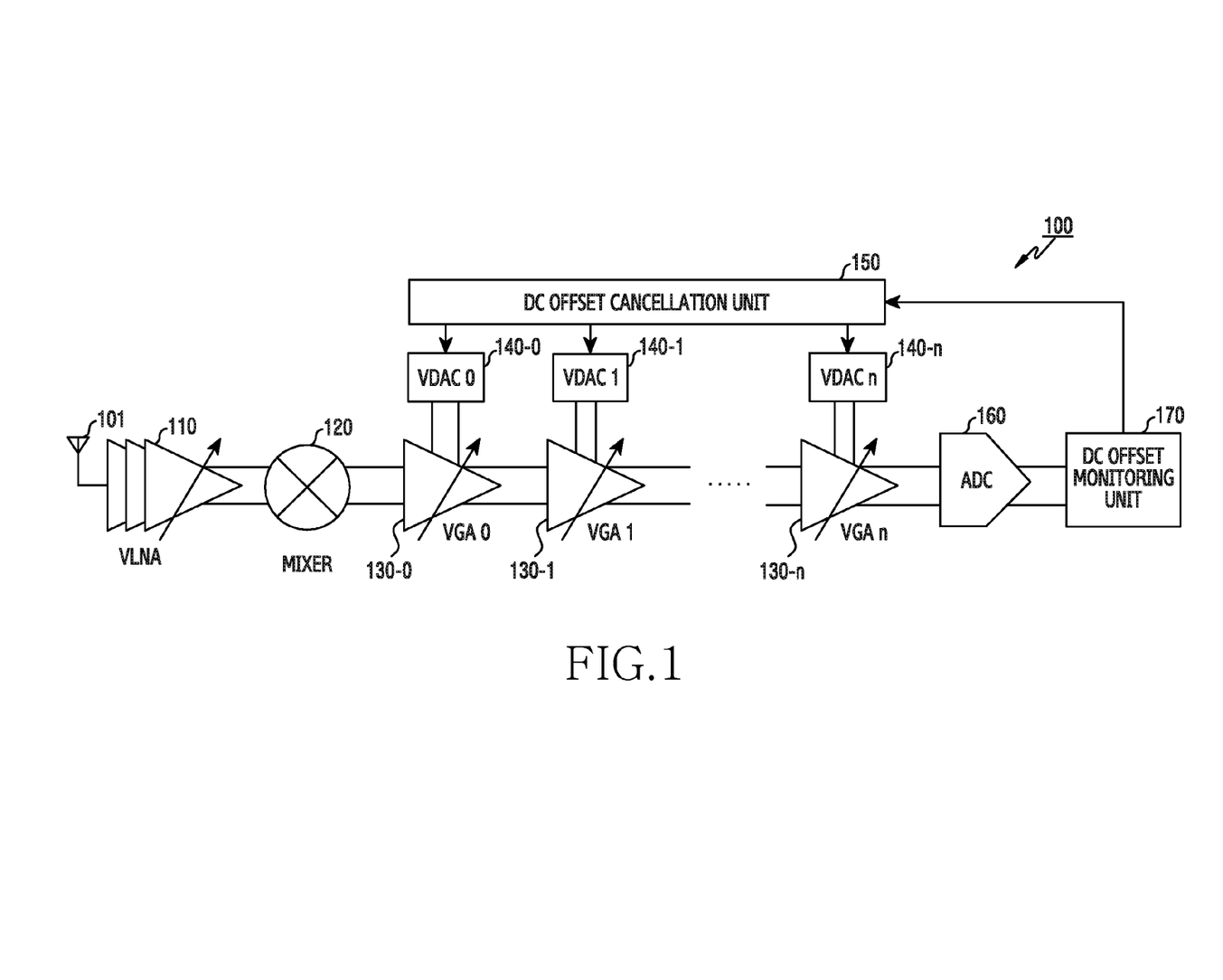
FIG. 1 is a diagram showing a structure of a direct conversion receiver according to an embodiment of the present invention.

FIG. 1 shows a structure of a direct conversion receiver 100 according to an embodiment of the present invention.

Referring to FIG. 1, the direct conversion receiver 100 can include at least one antenna 101, a Variable Low Noise Amplifier (VLNA) 110, a mixer 120, a plurality of Variable Gain Amplifiers (VGAs) 130-0 through 130-$n$, a plurality of Variable Digital to Analog Converters (VDACs) 140-0 through 140-$n$, a DC offset cancellation unit 150, an Analog to Digital Converter (ADC) 160, and a DC offset monitoring unit 170.

The variable low noise amplifier 110 amplifies a high frequency Radio Frequency (RF) signal received from the antenna 101 and provides to the mixer 120. The variable low noise amplifier 110 can amplify the high frequency RF signal based on a gain value which is changed according to a preset scheme.

The mixer 120 converts a signal received from the variable low noise amplifier 110 to a baseband signal and thus provides as an input of the zero-th variable gain amplifier 130-0 disposed at the very front end of the plurality of variable gain amplifiers 130-0 through 130-$n$. For example, the mixer 120 can generate a baseband signal by mixing the signal received from the variable low noise amplifier 110 and with a local oscillator signal, and output the generated baseband signal to the 0-th variable gain amplifier 130-0.

Each of the plurality of variable gain amplifiers 130-0 through 130-$n$ receive an output current from the corresponding variable DACs 140-0 through 140-$n$, and amplify and output an amplitude of the input signal based on a gain control signal according to an Automatic Gain Control (AGC) code. Herein, each of the plurality of variable gain amplifiers 130-0 through 130-n can be an amplifier of a differential structure having two input paths and two output signal paths. Among the plurality of variable gain amplifiers 130-0 through 130-n, the zero-th variable gain amplifier 130-0 receives the baseband signal from the mixer 120, amplifies its amplitude according to the AGC code, and then provides the amplified signal to the first variable gain amplifier 130-1. The first variable gain amplifier 130-1 receives the signal output from the zero-th variable gain amplifier 130-0, amplifies the amplitude according to the AGC code, and then provides the amplified signal to the second variable gain amplifier 130-2. In this manner, each of the plurality of variable gain amplifiers 130-0 through 130-n can amplify the baseband signal output from the mixer 120 multiple times, and the signal amplified multiple times is provided as an input of the ADC 160.

Each of the plurality of variable DACs 140-0 through 140-n include a circuit and switches for generating a base current $I_B$ in the form of the power of two. Each of the plurality of variable DACs 140-0 through 140-n can change a current output to a corresponding variable gain amplifier by controlling on/off of the switch based on the current control code input from the DC offset cancellation unit 150. Herein, a DC offset of an output stage of a corresponding variable gain amplifier 130-0 through 130-n can be changed according to the output current of each of the variable DACs 140-0 through 140-n.

Figure 2:
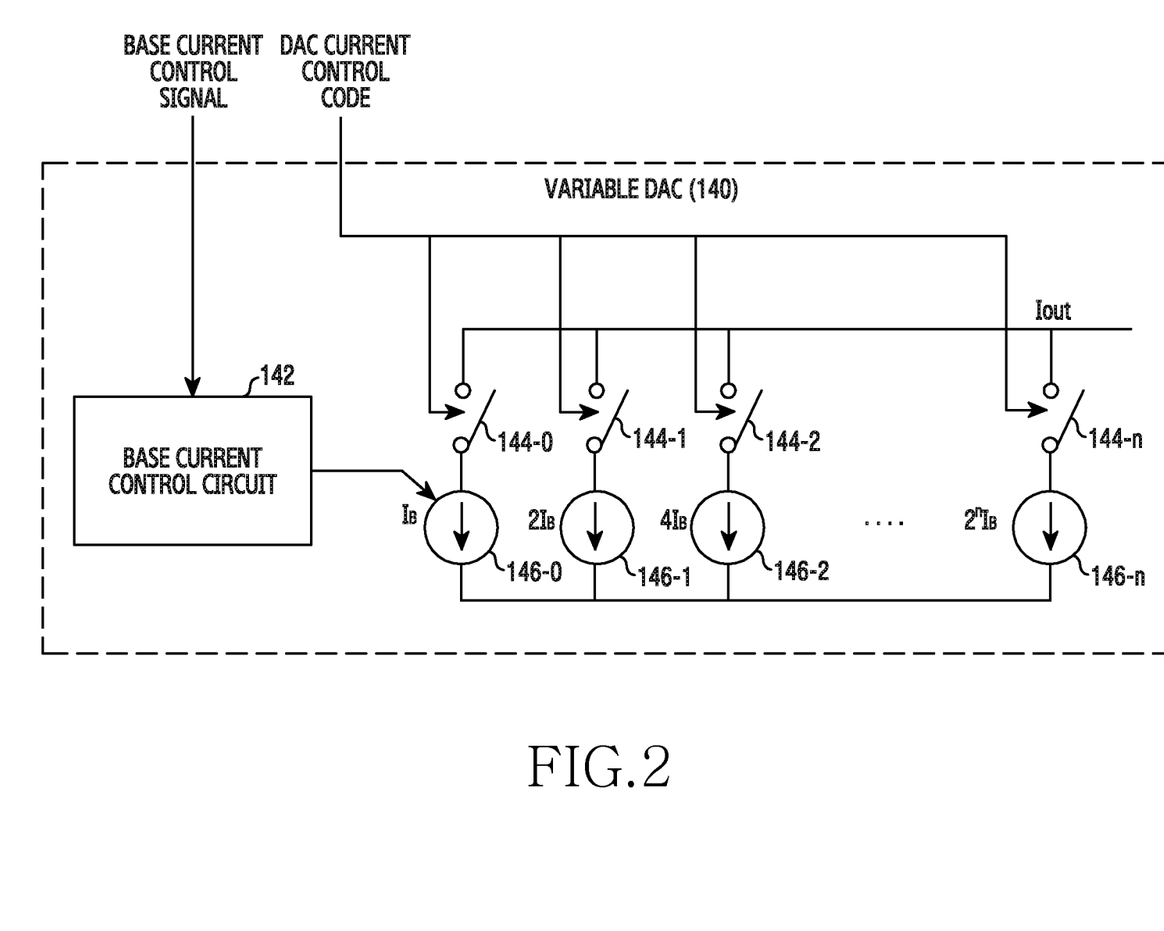
FIG. 2 is a diagram showing a simplified configuration of a variable Digital to Analog Converter (DAC) according to an embodiment of the present invention.

In the construction of each of the plurality of variable DACs 140-0 through 140-n, each variable DAC 140 includes, as shown in FIG. 2, a plurality of current sources 146-0 through 146-n for generating the base current as the power of two ($I_B$, $2I_B$, ..., $2^n I_B$,), and a plurality of switches 144-0 through 144-n connected to the current sources 146-0 through 146-n respectively, and can include a base current control circuit 142 for providing the base current to each of the current sources 146-0 through 146-n.

The variable DAC 140 receives a base current control code from the DC current cancellation unit 150, and controls the base current provided to the plurality of current sources 146-0 through 146-n according to the input base current control code. The plurality of current sources 146-0 through 146-n each generate the current corresponding to the power of two of the base current while a corresponding switch 144-0 through 144-n is turned on. A magnitude of the current generated in each of the plurality of current sources 146-0 through 146-n can have a linear increasing form.

The plurality of switches 144-0 through 144-n each are turned on or off according to the DAC current control code provided from the DC offset cancellation unit 150, and provides a current generated from the current source connected to a corresponding switch, to an output stage. For example, the plurality of switches 144-0 through 144-n each may be turned on simultaneously or turned off simultaneously, and some switches may be turned off and the remaining switches may be turned on, according to the DAC current control code.

The DC offset cancellation unit 150 performs a function for cancelling a DC offset generated by the variable gain amplifiers 130-0 through 130-n according to an embodiment of the present invention. Based on the DC offset of the output stage of the ADC 160 provided from the DC offset monitoring unit 170, the DC offset cancellation unit 150 retrieves and determines the DAC current control code which minimizes the DC offset per AGC code, and stores the determined DAC current control code information per AGC. Herein, the AGC code indicates a code for controlling the gain value of the plurality of variable gain amplifiers, and can be preset by a designer.

The DC offset cancellation unit 150 controls, when the system is powered on, the gain of the plurality of variable gain amplifier 130-0 through 130-n per AGC code while the whole receive path of the receiver is turned on and retrieves the current control code of each variable DAC to minimize the DC offset monitored at the output stage of the ADC 160. For example, the DC offset cancellation unit 150 controls the gain of the plurality of variable gain amplifiers 130-0 through 130-n based on the AGC code, and sequentially searches the DAC current control code with respect to each of the plurality of variable DACs 140-0 through 140-n. More specifically, with the gain of the plurality of variable gain amplifiers 130-0 through 130-n controlled based on a first AGC code, the DC offset cancellation unit 150 changes the current control code of the zero-th variable DAC 140-0 disposed at the very front end among the plurality of variable DACs 140-0 through 140-n, and retrieves the current control code of the zero-th DAC 140-0 to minimize the DC offset monitored at the output stage of the ADC. The current control code of the zero-th variable DAC 140-0 can be searched through a binary search method, and the current control codes of the other variable DACs 140-1 through 140-n should be maintained at a constant value during the current control code search of the zero-th variable DAC 140-0. Next, with the gain of the plurality of variable gain amplifiers 130-0 through 130-n controlled based on the first AGC code, the DC offset cancellation unit 150 changes the current control code of the first variable DAC 140-1 and searches for the current control code of the first variable DAC 140-1 to minimize the DC offset monitored at the output stage of the ADC. The current control code of the first variable DAC 140-1 can be searched through the binary search method, and the current control codes of the other variable DACs 140-0 and 140-2 through 14-n should be maintained at a constant value during the current control code search of the first variable DAC 140-1. In this manner, with the gain of the plurality of variable gain amplifiers 130-0 through 130-n controlled based on the first AGC code, the DC offset cancellation unit 150 determines the current control code for each of the plurality of variable DACs 140-0 through 140-n, and maps and stores the current control codes of the plurality of variable DACs 140-0 through 140-n, that is, a current control code set (or a current control code combination) with the first AGC code.

Figure 4:
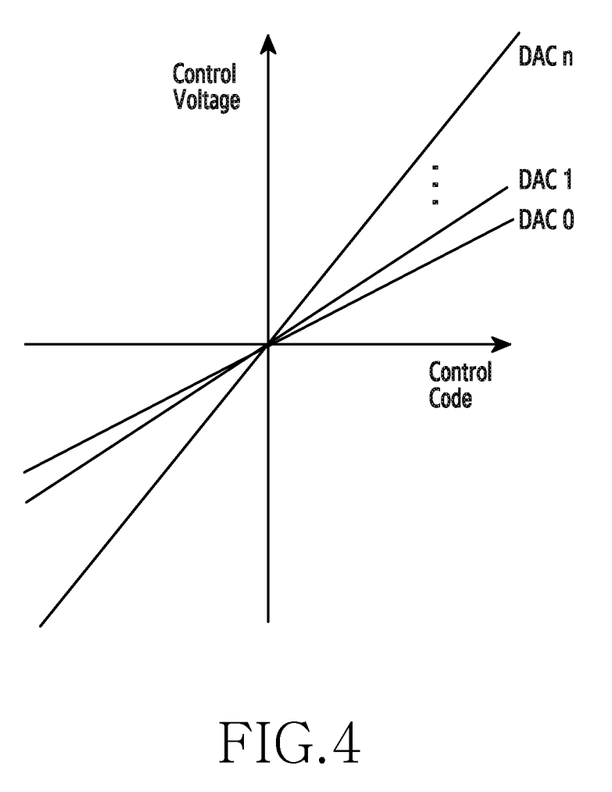
FIG. 4 is a diagram showing a relationship between a control current code of variable DACs and a DC offset calibration range of each variable DAC in a direct conversion receiver according to an embodiment of the present invention.

In addition, when retrieving the current control code of each variable DAC to minimize the DC offset, the DC offset cancellation unit 150 outputs a base current control signal so that the variable DAC at the very front end among the plurality of variable DACs 140 uses the smallest base current and the variable DAC at a later end uses a greater base current than the front-end variable DAC. As shown in FIG. 4, it is to consider a situation where the DC offset increases in the variable gain amplifier at the later end among the plurality of variable gain amplifiers 130-0 through 130-n according to a feature that the DC offset increases as the gain increases. That is, it is to more precisely control the DC offset generated by the variable gain amplifier at the later end by controlling an output current range provided to the variable gain amplifier at the later end to be wider than an output current range provided to the variable gain amplifier at the front.

The DC offset cancellation unit 150 obtains the DAC current control code set for all of the preset AGC codes in the above-stated manner, and maps and stores the obtained DAC current control code set with corresponding AGC codes.

Figure 3:
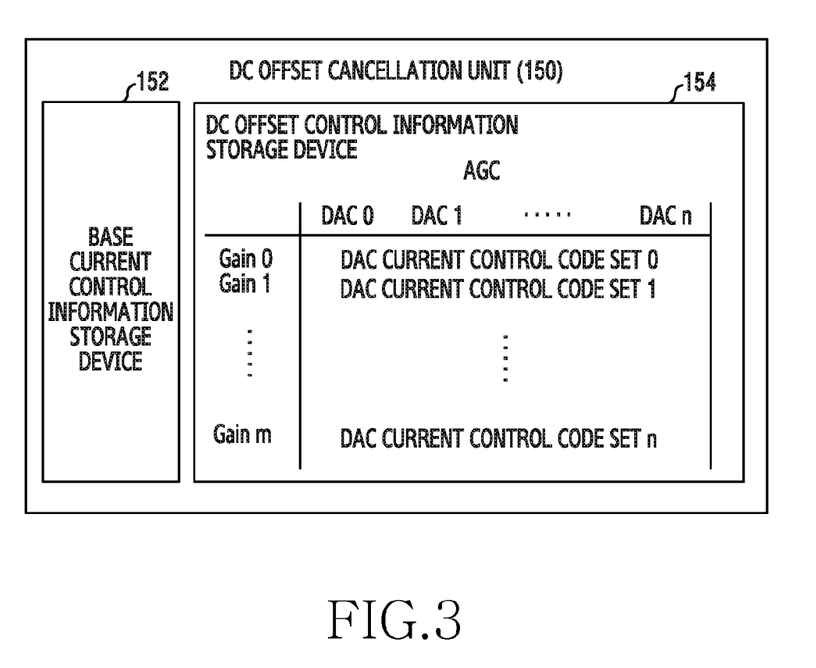
FIG. 3 is a diagram showing a simplified configuration of a Direct Current (DC) offset cancellation unit according to an embodiment of the present invention.

The DC offset cancellation unit 150 according to an embodiment of the present invention includes, as shown in FIG. 3, a base current control information storage device 152 and a DC offset control information storage device 154, and can store base current control information and DAC current control code information per AGC code. For example, the base current control information storage device 152 can store the base current information to be provided to each of the variable DACs, and store the base current change information according to a temperature change. Also, the DC offset control information storage device 154 can, as described above, represent a mapping relationship of the current control codes of the variable DACs for each AGC code by storing the DAC current control code set for the AGC codes respectively.

After completing an initial DC offset calibration process which retrieves and stores the DAC current control code set for all of the AGC codes, when the direct conversion receiver 100 operates in a signal reception mode, the DC offset cancellation unit 150 minimizes the DC offset by controlling the output current of the variable DACs 140-0 through 140-*n* based on the DAC current control code set corresponding to the selected AGC code.

Also, the DC offset cancellation unit 150 can periodically monitor the DC offset monitored at the output stage of the ADC 160 during an operation using a preset DAC current control code set, and perform the DC offset calibration process using the base current control when the DC offset is outside a preset threshold range. For example, the DC offset cancellation unit 150 can periodically monitor the DC offset after the initial DC offset calibration process, and when the monitored DC offset is outside the threshold range, sequentially change the base current of each variable DAC so that the DC offset corresponds to the threshold range without changing the variable DAC current control code set. This is to prepare for a situation where a current amount of each variable DAC changes because a temperature of the system changes as the time passes and thus the DC offset can change.

The ADC 160 converts and outputs the amplified analog signal from the n-th variable gain amplifier 130-*n* to a digital signal.

The DC offset monitoring unit 170 monitors a DC offset value by monitoring the output signal of the ADC 160. For example, the DC offset monitoring unit 170 can monitor a voltage value output through the two output signal paths of the ADC 160, and determine a difference value of the two monitored voltage values as the DC offset. The DC offset monitoring unit 170 provides the monitored DC offset to the DC offset cancellation unit 150. When the system including the direct conversion receiver 100 is powered on, the DC offset monitoring unit 170 can estimate the DC offset for the DC offset calibration and perform an operation for providing the estimated DC offset value to the DC offset cancellation unit 150. Also, the DC offset monitoring unit 170 may periodically estimate the DC offset and provide it to the DC offset cancellation unit 150.

In various embodiments of the present invention, an apparatus for DC offset calibration of a direct conversion receiver can include a plurality of variable gain amplifiers for amplifying an input signal based on a gain control value, a DC offset monitoring unit for monitoring a DC offset for an output signal of the plurality of variable gain amplifiers, a plurality of variable DACs for controlling a current applied to each of the plurality of variable gain amplifiers according to a current control code, and a DC offset cancellation unit for determining a current control code set which minimizes the DC offset value per preset gain control value.

In various embodiments of the present invention, the variable DAC can include a plurality of switches for being turned on/off according to the current control code, a plurality of current sources connected to the switches respectively and generating a current corresponding to a power of two, and a base current control circuit for providing a base current to the plurality of current sources.

In various embodiments of the present invention, when the direct conversion receiver is turned on, the DC offset cancellation unit can obtain the current control code of each variable DAC to minimize the DC offset value by changing a current control code for each of the plurality of variable DACs, per preset gain control value.

In various embodiments of the present invention, when a gain of the plurality of variable gain amplifiers is set to a particular gain control value, the DC offset cancellation unit can search for a current control code to minimize the DC offset value from a variable DAC disposed at a front end among the plurality of variable DACs, configure one current control code set with the current control code searched for the plurality of variable DACs respectively, and map and store the configured current control code set with the particular gain control value.

In various embodiments of the present invention, when searching for the current control code for each of the plurality of variable DACs, the DC offset cancellation unit can control a base current of a variable DAC disposed at a back end to have a greater value than a base current of a variable DAC disposed at a front end among the plurality of variable DACs.

In various embodiments of the present invention, when searching for the current control code for each of the plurality of variable DACs, the DC offset cancellation unit can search for the current control code using a binary search method.

In various embodiments of the present invention, an Analog to Digital Converter (ADC) for converting a signal output from the plurality of variable gain amplifiers to a digital signal is further included, and the DC offset monitoring unit can monitor a DC offset for an output signal of the ADC.

In various embodiments of the present invention, in a signal reception mode, the DC offset cancellation unit can control an output current of the variable DAC using the determined current control code set corresponding to a gain control value.

In various embodiments of the present invention, in a signal reception mode, the DC offset cancellation unit can compare a DC offset value periodically provided from the DC offset monitoring unit with a preset threshold range, and when the DC offset value is outside the preset threshold range, regulate a base current used by the plurality of variable DACs.

In various embodiments of the present invention, when the DC offset value is outside the preset threshold range, the DC offset cancellation unit can maintain a current control set being used by the plurality of variable DACs without changing.

Figure 5:
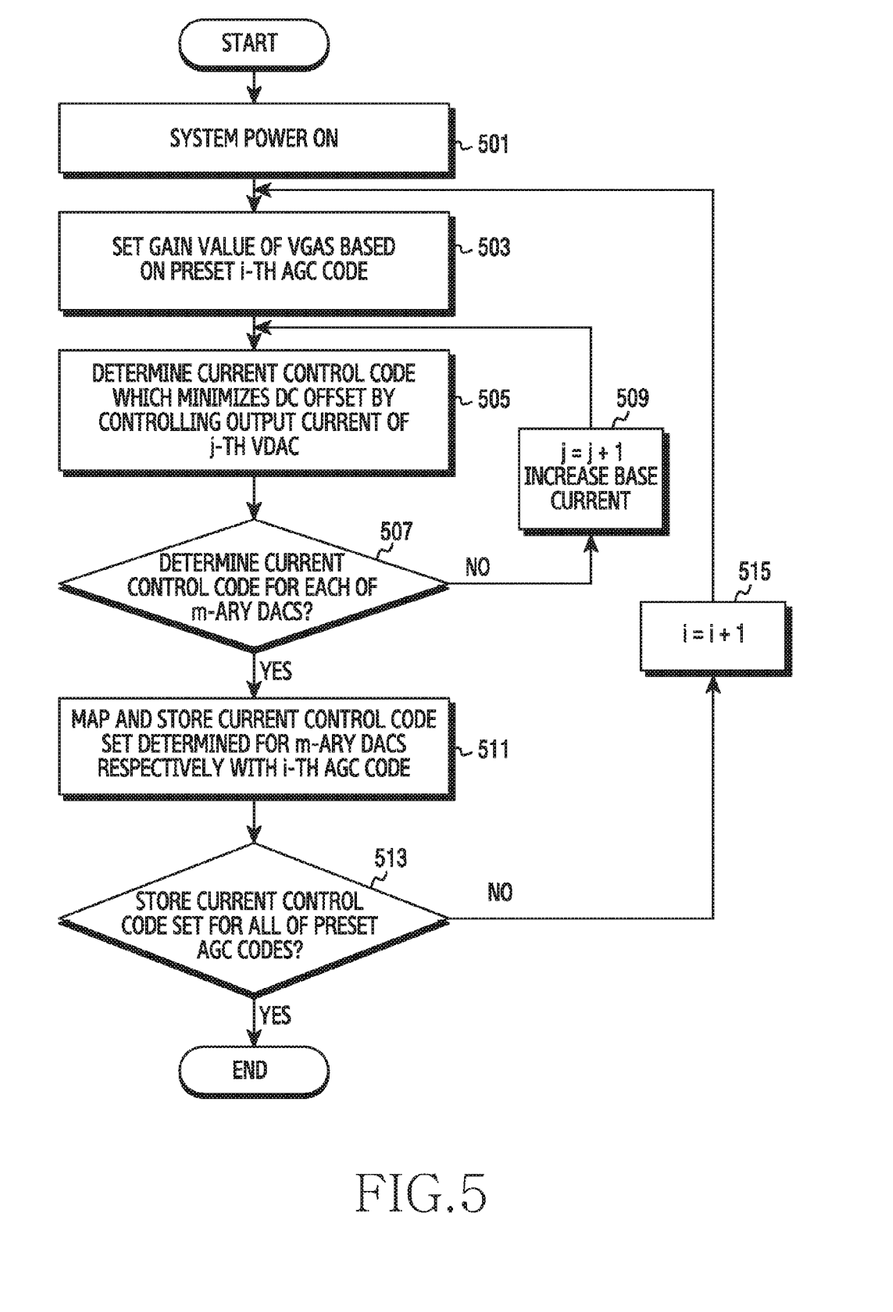
FIG. 5 is a diagram showing a DC offset calibration process in a direct conversion receiver according to an embodiment of the present invention.

FIG. 5 depicts a DC offset calibration process in a direct conversion receiver 100 according to an embodiment of the present invention. FIG. 5 illustrates an initial DC offset calibration process which retrieves and stores a DCA current control code set for every AGC code preset when the system including the direct conversion receiver 100 is powered on.

Referring to FIG. 5, the direct conversion receiver 100 detects the power-on of the system in step 501. After detecting the system power on, the direct conversion receiver 100 sets the gain value of the plurality of variable gain amplifiers 130-0 through 130-$n$ based on a preset i-th AGC code in step 503. The AGC code indicates a code for controlling the gain value of the plurality of variable gain amplifiers 130-0 through 130-$n$, and can be preset by the designer.

Next, the direct conversion receiver 100 determines the DAC current control code which minimizes the DC offset by controlling the output current of the j-th variable DAC in step 505. For example, while the gains of the plurality of variable gain amplifiers 130-0 through 130-$n$ are set based on a first AGC code, the direct conversion receiver 100 can change the output current by controlling on/off of the current control switches 144-0 through 144-0 through the current control code change in the j-th variable DAC. The direct conversion receiver 100 can monitor the DC offset of the output stage of the ADC 160 per current control code of the j-th variable DAC, and thus determine the current control code which minimizes the DC offset. The direct conversion receiver 100 can retrieve and determine the current control code which minimizes the DC offset using the binary search method. Also, the direct conversion receiver 100 maintains the current control code of the remaining variable DACs excluding the j-th variable DAC as a constant value so that the DC offset is not changed by other variable DACs during the DAC current control code search for the j-th variable DAC.

The direct conversion receiver 100 checks whether the current control code is determined for each of m-ary variable DACs in step 507. Herein, m indicates the total number of variable DACs connected to the plurality of variable gain amplifiers in the direct conversion receiver 100. That is, with the gain of the plurality of variable gain amplifiers 130-0 through 130-$n$ set based on the i-th AGC code, the direct conversion receiver 100 checks whether the current control code for every variable DAC is determined. When the current control code for every variable DAC is not determined, the direct conversion receiver 100 updates j with j+1 and increases the base current in step 509, and then proceeds to step 505. That is, when the current control code for every variable DAC is not determined, the direct conversion receiver 100 updates the value j so as to retrieve the DAC current control code for a next variable DAC. Also, the direct conversion receiver 100 regulates the magnitude of the base current so that the magnitude of the base current of the next variable DAC is greater than the magnitude of the base current of a front-end variable DAC.

On the other hand, when the current control code for every variable DAC is determined, the direct conversion receiver 100 maps and stores the DAC current control code set determined for the m-ary variable DACs respectively with the i-th AGC code in step 511. That is, the direct conversion receiver 100 can map and store the DAC current control code set including the current control codes determined for the plurality of variable DACs respectively determined with the determined gain of the plurality of variable gain amplifiers 130-0 through 130-$n$, with the i-th AGC code. For example, as shown in FIG. 3, the i-th AGC code indicating Gain 0 can be mapped and stored with a DAC current control code set which combines a current control code of DAC 0, a current control code of DAC 1, . . . , and, a current control code of DAC n.

Next, the direct conversion receiver 100 checks whether the DAC current control code set is stored for all of the preset AGC codes in step 513. When the DAC current control code set is not stored for all of the preset AGC codes, the direct conversion receiver 100 updates i with i+1 in step 515 and proceeds to step 503. That is, when the DAC current control code set is not obtained for all of the preset AGC codes, the direct conversion receiver 100 updates the value i to search for the DAC current control code with respect to the AGC code not obtaining the DAC current control code set.

On the other hand, when the DAC current control code set is stored for all of the preset AGC codes, the direct conversion receiver 100 finishes the DC offset calibration process according to an embodiment of the present invention.

As explained above, by pre-storing the DAC current control code set which minimizes the DC offset for all of the AGC codes through the initial DC offset calibration process when the system is powered on, an embodiment of the present invention can prevent performance degradation of the direct conversion receiver 100 by minimizing the DC offset by controlling the output current of each variable DAC with the pre-stored DAC current control code set according to the AGC code when a signal is actually received.

Figure 6:
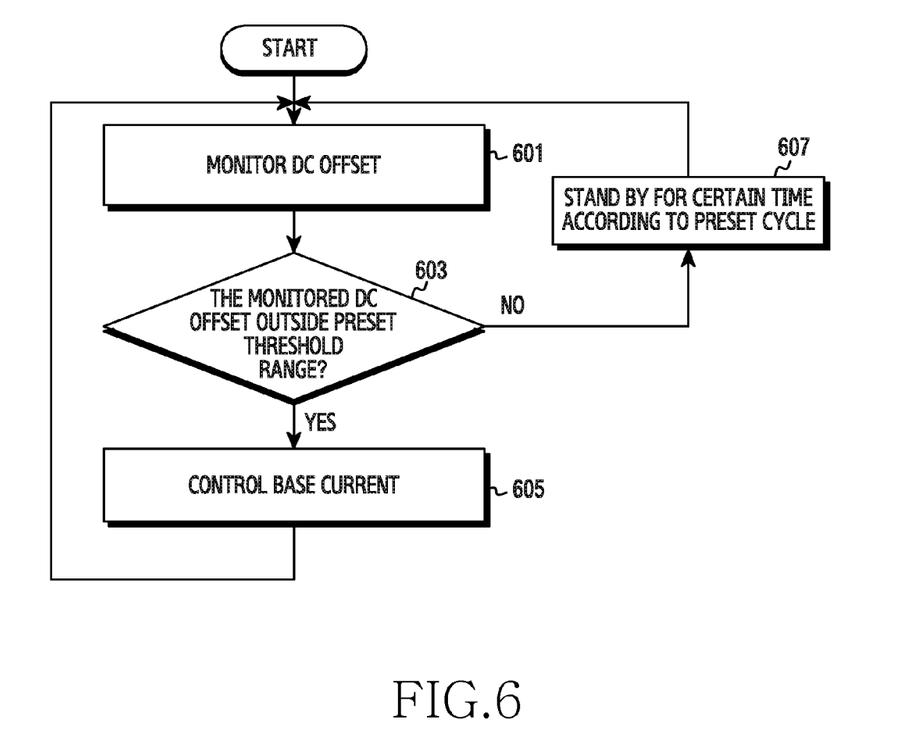
FIG. 6 is a diagram showing a DC offset calibration process due to a temperature change in a direct conversion receiver according to another embodiment of the present invention.

FIG. 6 depicts a DC offset calibration process in a direct conversion receiver 100 according to another embodiment of the present invention. FIG. 6 illustrates a periodic DC offset calibration process conducted after an initial DC offset calibration process is finished in a system including the direct conversion receiver 100.

Referring to FIG. 6, the direct conversion receiver 100 monitors a DC offset of the output stage of the ADC 160 in step 601. Next, the direct conversion receiver 100 determines whether the monitored DC offset is outside a preset threshold range in step 603

When the monitored DC offset is not outside the preset threshold range, the direct conversion receiver 100 determines that the DC offset calibration is not necessary, stands by for a certain time according to a preset cycle in step 607, and then goes back to step 601.

On the other hand, when the monitored DC offset is outside the preset threshold range, the direct conversion receiver 100 determines that the DC offset calibration is necessary and controls the base current of each of the plurality of variable DACs 140-0 through 140-$n$ in step 605. That is, when the monitored DC offset is outside the preset threshold range, the direct conversion receiver 100 can sequentially control the base current of each variable DAC so that the DC offset of the ADC output stage corresponds to the threshold range while not changing the DAC current control code which is currently set to each variable DAC. Next, the direct conversion receiver 100 returns to step 601 and performs the following steps.

In various embodiments of the present invention, a method for DC offset calibration of a direct conversion receiver can include controlling, at a plurality of variable DACs, a current applied to each of a plurality of variable gain amplifiers by controlling a current control code, amplifying, at the plurality of variable gain amplifiers, an input signal based on a gain control value, monitoring a DC offset for an output signal amplified through the plurality of variable gain amplifiers, and determining a current control code set which minimizes the DC offset value per preset gain control value based on the DC offset monitoring result.

In various embodiments of the present invention, controlling, at the plurality of variable DACs, the current applied to each of the plurality of variable gain amplifiers by controlling the current control code can include controlling to turn on/off a plurality of switches according to the current control code, and generating a current corresponding to a power of two of a base current through a plurality of current sources connected to the plurality of switches respectively.

In various embodiments of the present invention, determining the current control code set which minimizes the DC offset value per preset gain control value can include obtaining the current control code of each variable DAC to minimize the DC offset value by changing a current control code for each of the plurality of variable DACs, per preset gain control value.

In various embodiments of the present invention, obtaining the current control code of each variable DAC can include, when a gain of the plurality of variable gain amplifiers is set to a particular gain control value, searching for a current control code which minimizes the DC offset value from a variable DAC disposed at a front end among the plurality of variable DACs, configuring one current control code set with the current control code searched for the plurality of variable DACs respectively, and mapping and storing the configured current control code set with the particular gain control value.

In various embodiments of the present invention, when searching for the current control code, the DC offset calibration method can control a base current of a variable DAC disposed at a back end to have a greater value than a base current of a variable DAC disposed at a front end among the plurality of variable DACs.

In various embodiments of the present invention, when searching for the current control code, the DC offset calibration method can search for the current control code using a binary search method.

In various embodiments of the present invention, monitoring the DC offset for the output signal amplified through the plurality of variable gain amplifiers can include converting a signal output from the plurality of variable gain amplifiers to a digital signal, and monitoring a DC offset for the signal converted to the digital signal.

In various embodiments of the present invention, the DC offset calibration method can further include, after determining the current control code set, operating in a signal reception mode, and when operating in the signal reception mode, controlling an output current of the variable DAC using a current control code set corresponding to a gain control value.

In various embodiments of the present invention, the DC offset calibration method can further include, in a signal reception mode, periodically monitoring a DC offset for an output signal amplified through the plurality of variable gain amplifiers, comparing a DC offset value periodically monitored with a preset threshold range, and when the DC offset value is outside the preset threshold range, regulating a base current used by the plurality of variable DACs.

In various embodiments of the present invention, the DC offset calibration method can further include, when the DC offset value is outside the preset threshold range, maintaining a current control code set being used by the plurality of variable DACs without changing.

As above, while the present invention has been described with reference to specific embodiments and drawings, the present invention is not limited to the mentioned embodiments and those skilled in the art to which the present invention pertains can make various modifications and changes from the disclosure.

Operation according to an embodiment of the present invention can be implemented by a single controller. In this case, program instructions for fulfilling operations embodied by various computers can be recorded in a computer-readable medium. The computer-readable medium can include program instructions, data files, and data structures, alone or in combination. The program instructions may be specially designed and configured for the present invention or known to and used by those of ordinary skilled in the art. Examples of the computer-readable recording medium include a hard disk, a magnetic medium such as a floppy disk and a magnetic tape, an optical recording medium such as Compact Disc (CD)-Read Only Memory (ROM) or a Digital Versatile Disc (DVD), magneto-optical medium such as a floptical disk, and hardware devices specially configured to store and execute program instructions such as ROM, Random Access Memory (RAM), and flash memory. Examples of the program instructions include not only a machine code made by a compiler but also a high-level language code executable by a computer using an interpreter. When all or part of a base station or a relay explained in the present invention is realized as a computer program, the computer-readable recording medium storing the computer program is also included in the present invention. Accordingly, the scope of the present invention is not limited and confined to the described embodiments, and should be defined by the claims as below and their equivalents.

The invention claimed is:

1. An apparatus for direct current (DC) offset calibration of a direct conversion receiver, the apparatus comprising:
a plurality of serially connected variable gain amplifiers configured to amplify an input signal based on respective preset gain control values;
a DC offset monitoring unit configured to monitor a DC offset for an output signal of the plurality of variable gain amplifiers;
a plurality of variable digital to analog converters (DACs) configured to control a current applied to each of the plurality of variable gain amplifiers according to respective current control codes; and
a DC offset cancellation unit configured to determine a current control code set which minimizes the DC offset value per each of the preset gain control values,
wherein each of the plurality of DACs corresponds to each of the plurality of variable gain amplifiers.

2. The apparatus of claim 1, wherein each of the variable DACs comprises:
a plurality of switches configured to be turned on/off according to the current control code;
a plurality of current sources connected to the plurality of switches respectively and configured to generate a current corresponding to a power of two; and
a base current control circuit configured to provide a base current to the plurality of current sources.

3. The apparatus of claim 1, wherein, when the direct conversion receiver is turned on, the DC offset cancellation unit is further configured to determine a current control code of each variable DAC to minimize the DC offset value by changing the current control code for each of the plurality of variable DACs, per preset gain control value.

4. The apparatus of claim 3, wherein, when a gain of the plurality of variable gain amplifiers is set to a particular gain control value, the DC offset cancellation unit is further configured to:
search for the current control code which minimizes the DC offset value, from a first variable DAC disposed at a front end to a last variable DAC disposed at a back end, configure one current control code set with current control codes searched for the plurality of variable DACs respectively, and map and store the configured current control code set with the particular gain control value.

5. The apparatus of claim 3, wherein, when determining the current control code for each of the plurality of variable DACs, the DC offset cancellation unit is further configured to control a base current of a variable DAC disposed at a back end to have a greater value than a base current of a variable DAC disposed at a front end among the plurality of variable DACs.

6. The apparatus of claim 1, further comprising:
an analog to digital converter (ADC) configured to convert a signal output from the plurality of variable gain amplifiers to a digital signal,
wherein the DC offset monitoring unit is further configured to monitor a DC offset for the output signal of the ADC.

7. The apparatus of claim 1, wherein, in a signal reception mode, the DC offset cancellation unit is further configured to control an output current of the variable DAC using the current control code set corresponding to the gain control values.

8. The apparatus of claim 7, wherein, in a signal reception mode, the DC offset cancellation unit is further configured to:
compare a DC offset value periodically provided from the DC offset monitoring unit with a preset threshold range,
when the DC offset value is outside the preset threshold range, regulate a base current used by the plurality of variable DACs, and
maintain the current control code set used by the plurality of variable DACs without changing.

9. A method of operating a direct conversion receiver for direct current (DC) offset calibration, the method comprising:
controlling, at a plurality of variable digital to analog converters (DACs), a current applied to each of a plurality of serially connected variable gain amplifiers using current control codes;
amplifying, at the plurality of variable gain amplifiers, an input signal based on respective preset gain control values;
monitoring a DC offset for an output signal amplified through the plurality of variable gain amplifiers; and
determining a current control code set which minimizes the DC offset value per each of the preset gain control values based on the DC offset monitoring result,
wherein each of the plurality of DACs corresponds to each of the plurality of variable gain amplifiers.

10. The method of claim 9, wherein the controlling, at the plurality of variable DACs, of the current applied to each of the plurality of variable gain amplifiers using the current control codes comprises:
controlling on/off of a plurality of switches according to the current control codes; and generating a current corresponding to a power of two of a base current through a plurality of current sources connected to the plurality of switches respectively.

11. The method of claim 9, wherein the determining of the current control code set which minimizes the DC offset value per the preset gain control value comprises:
determining a current control code of each variable DAC to minimize the DC offset value, per the preset gain control value.

12. The method of claim 11, wherein the determining of the current control code of each variable DAC comprises:
when a gain of the plurality of variable gain amplifiers is set to a particular gain control value, searching for the current control code which minimizes the DC offset value from a first variable DAC disposed at a front end to a last variable DAC disposed at a back end;
configuring one current control code set with current control codes searched for the plurality of variable DACs respectively; and
mapping and storing the configured current control code set with the particular gain control value.

13. The method of claim 11, wherein, when determining the current control code, a base current of a variable DAC disposed at a back end is controlled to have a greater value than a base current of a variable DAC disposed at a front end among the plurality of variable DACs.

14. The method of claim 9, wherein monitoring the DC offset for the output signal amplified through the plurality of variable gain amplifiers comprises:
converting a signal output from the plurality of variable gain amplifiers to a digital signal; and
monitoring a DC offset for the signal converted to the digital signal.

15. The method of claim 14, further comprising:
in a signal reception mode, periodically monitoring a DC offset for the output signal amplified through the plurality of variable gain amplifiers;
comparing the DC offset value periodically monitored with a preset threshold range; and
when the DC offset value is outside the preset threshold range, regulating a base current used by the plurality of variable DACs, and maintaining the current control code set used by the plurality of variable DACs without changing.

16. The apparatus of claim 3, wherein the DC offset cancellation unit determines the current control code of each of the variable DAC using a binary search method.

17. The method of claim 9, further comprising:
controlling, in a signal reception mode, an output current of the variable DAC using the current control code set corresponding to a gain control value, after the current control code set is determined.

18. The method of claim 11, wherein the determining of the current control code of each of the variable DAC comprises:
determining the current control code of each of the variable DAC using a binary search method.

* * * * *